US012813290B2

(12) United States Patent
Luan

(10) Patent No.: US 12,813,290 B2
(45) Date of Patent: Nov. 24, 2026

(54) HYBRID QUAD FLAT NO-LEADS (QFN) INTEGRATED CIRCUIT PACKAGE

(71) Applicant: STMicroelectronics International N.V., Plan-les-Ouates (CH)

(72) Inventor: Jing-En Luan, Singapore (SG)

(73) Assignee: STMicroelectronics International N.V., Geneva (CH)

( * ) Notice: Subject to any disclaimer, the term of this patent is extended or adjusted under 35 U.S.C. 154(b) by 353 days.

(21) Appl. No.: 18/429,009

(22) Filed: Jan. 31, 2024

(65) Prior Publication Data

US 2024/0332143 A1 Oct. 3, 2024

Related U.S. Application Data

(60) Provisional application No. 63/455,388, filed on Mar. 29, 2023.

(51) Int. Cl.

| | |
|---|---|
| ***H10W 70/40*** | (2026.01) |
| ***H10W 40/10*** | (2026.01) |
| ***H10W 74/01*** | (2026.01) |
| ***H10W 74/10*** | (2026.01) |
| *H10W 72/00* | (2026.01) |
| *H10W 90/00* | (2026.01) |

(52) U.S. Cl.
CPC ......... *H10W 70/435* (2026.01); *H10W 40/10* (2026.01); *H10W 70/417* (2026.01); *H10W 70/464* (2026.01); *H10W 74/019* (2026.01); *H10W 74/111* (2026.01); *H10W 72/073* (2026.01); *H10W 90/736* (2026.01)

(58) Field of Classification Search
CPC ............. H10W 70/435; H10W 70/417; H10W 70/464; H10W 74/019; H10W 74/111; H10W 40/10; H10W 72/073; H10W 90/736
USPC .......................................................... 257/676
See application file for complete search history.

(56) References Cited

U.S. PATENT DOCUMENTS 8,283,212 B2 * 10/2012 Xue .................... H10W 70/411 438/123
11,417,538 B2 * 8/2022 Gan .................... H10P 72/1904
12,062,600 B2 * 8/2024 Hayashi .............. H10W 70/424
2011/0244629 A1 10/2011 Gong et al.
(Continued)

FOREIGN PATENT DOCUMENTS

JP 60244035 A 12/1985

OTHER PUBLICATIONS

EPO Search Report and Written Opinion for counterpart EP Appl. No. 24163723.0, report dated Aug. 29, 2024, 13 pgs.

*Primary Examiner* — Tu-Tu V Ho
(74) *Attorney, Agent, or Firm* — Crowe & Dunlevy LLC

(57) ABSTRACT

A hybrid QFN package includes an encapsulant body that encapsulates a lead frame and integrated circuit (IC) device where the lead frame includes a die pad and vertically offset leads. Back sides of the die pad and encapsulant body are coplanar at first surface. Front sides of the leads, the IC device and the encapsulant body are substantially coplanar at a second surface. An insulating layer covers the second surface except at a portion of the leads located at the peripheral edge of the encapsulating body. Vias extend through the insulating layer to the leads and IC device. Wiring lines on the insulating layer interconnect the vias. A passivation layer covers the wiring lines and vias.

7 Claims, 7 Drawing Sheets

(56) References Cited

U.S. PATENT DOCUMENTS

| | | | |
|---|---|---|---|
| 2015/0084171 | A1 | 3/2015 | Ma et al. |
| 2016/0099238 | A1 | 4/2016 | Niu et al. |
| 2018/0342453 | A1 | 11/2018 | Ziglioli |
| 2019/0088574 | A1 | 3/2019 | Kim et al. |
| 2020/0083150 | A1 | 3/2020 | Shimizu et al. |
| 2021/0035879 | A1 | 2/2021 | Kessler et al. |
| 2022/0157715 | A1 | 5/2022 | Zhai |

* cited by examiner

HYBRID QUAD FLAT NO-LEADS (QFN) INTEGRATED CIRCUIT PACKAGE

CROSS REFERENCE TO RELATED APPLICATIONS

This application claims priority to U.S. Provisional Application for Patent No. 63/455,388, filed Mar. 29, 2023, the disclosure of which is incorporated herein by reference.

TECHNICAL FIELD

The present invention generally relates to an integrated circuit package and, in particular, to a hybrid quad flat no-leads (QFN) type package for an integrated circuit device.

BACKGROUND

Reference is made to FIG. 1 which shows a cross-section of a conventional quad flat no-leads (QFN) type package 10 for an integrated circuit (IC) device 12. A lead frame 14 includes a die pad 16 and a plurality of leads 18. The back side of the integrated circuit device 12 (i.e., the IC die) is mounted to the die pad 16 by a suitable adhesive material 20 (for example, a silver epoxy or a die attach film). Wire bonding 22 is used to electrically connect pads at the front side of the IC device 12 to the leads 18. The assembly of the lead frame 14, IC device 12, and wire bonding 22 is encapsulated within an encapsulating body 24 made, for example, of a resin material.

As an alternative to wire bonding, for example in cases where high current conduction is required, electrical connection between certain pads at the front side of the IC device 12 and certain leads 18 of the lead frame 14 may instead utilize a metal clip (or ribbon) 26 as shown with the QFN type package 10 shown in FIG. 2.

In another implementation of the QFN type package 10 as shown in FIG. 3, the assembly of the lead frame 14 and IC device 12 is encapsulated in a laser direct structuring (LDS) material to form a first encapsulant body 30. Directed laser energy is then used to activate the LDS material at trace locations and via locations at the upper surface of the first encapsulant body 30. A plating process at the activated trace locations and via locations forms wiring lines 32, conductive vias 34 reaching the pads at the front side of the IC device 12 and conductive vias 36 reaching the leads 18. The assembly of the lead frame 14, IC device 12, wiring lines 32, conductive vias 34 and conductive vias 36 is encapsulated within a second encapsulant body 38 made, for example, of a resin material.

With reference to FIG. 4, it will be noted that the bottom surfaces of the die pad 16 and plurality of leads 18 are exposed from the encapsulating body 24 at the bottom surface of the QFN type package 10, and also that distal ends of the plurality of leads 18 (which may include wettable flanks) are exposed from the encapsulating body 24 at the peripheral side edges of the QFN type package 10.

Concerns with the known QFN type packages, like those of FIGS. 1, 2 and 3, include a need for: package miniaturization; integration of multiple dice; and improved reliability.

SUMMARY

In an embodiment, an integrated circuit package comprises: a lead frame including a die pad and a plurality of leads, wherein the leads are vertically offset from the die pad; an integrated circuit device mounted to the die pad, with a front surface of the integrated circuit device substantially coplanar with a front surface of the plurality of leads; an encapsulant body that encapsulates the lead frame and integrated circuit device; wherein a front surface of the encapsulant body is coplanar with the substantially coplanar front surfaces of the integrated circuit device and the plurality of leads; an insulating layer covering the coplanar front surfaces of the integrated circuit device and the encapsulant body and further covering a first portion of the front surfaces of the plurality of leads with a second portion of the front surfaces of the plurality of leads at a peripheral edge of the encapsulant body being uncovered by the insulating layer; a patterned metal layer on the insulating layer forming wiring lines; vias connected to the wiring lines of the patterned metal layer and extending through the insulating layer to connect to the front surface of the lead and to pads at the front surface of the integrated circuit device; and a passivation layer covering the wiring lines of the patterned metal layer.

In an embodiment, a method comprises: providing a lead frame that includes a die pad and leads, wherein the lead frame is shaped with a bend to vertically offset the leads from the die pads; mounting a back side of an integrated circuit (IC) device to each die pad to form a first assembly; wherein front surfaces of the IC devices are substantially coplanar with front surfaces of the leads; mounting the first assembly to a first supporting substrate with the substantially coplanar front surfaces of the IC devices and the leads in contact with the first supporting substrate to form a second assembly; encapsulating the second assembly in an encapsulant body having a back surface coplanar with a back surface of the die pad; mounting a second supporting substrate to the coplanar back surfaces of the encapsulant body and die pad; removing the first supporting substrate to expose coplanar front surfaces of the IC devices, the leads and the encapsulant body; laminating a resin coated copper (RCC) layer to the exposed coplanar front surfaces of the IC devices, the leads and the encapsulant body; forming via openings extending through the copper and resin of the RCC layer and plating those via openings to form vias connecting to the front surfaces of the leads and to pads of the IC devices; patterning the copper of the RCC layer to form wiring lines connected to the vias; selectively removing resin of the RCC layer to expose portions of the leads; cutting partially through the leads at the exposed portions to form wettable flank openings; plating the wettable flank openings; and cutting through a remainder of the leads at the wettable flank openings and further extending cutting though the encapsulant body to singulate packages.

In an embodiment, an integrated circuit package comprises: an encapsulant body that encapsulates a lead frame and integrated circuit (IC) device; wherein the lead frame includes a die pad and vertically offset leads; wherein back sides of the die pad and encapsulant body are coplanar at first surface; wherein front sides of the leads, the IC device and the encapsulant body are substantially coplanar at a second surface; an insulating layer covering the second surface except at a portion of the leads located at a peripheral edge of the encapsulating body; vias extending through the insulating layer to the leads and the IC device; wiring lines on the insulating layer that interconnect the vias; and a passivation layer covers the wiring lines and vias.

BRIEF DESCRIPTION OF THE DRAWINGS

For a better understanding of the embodiments, reference will now be made by way of example only to the accompanying figures in which.

DETAILED DESCRIPTION

Figure 1:
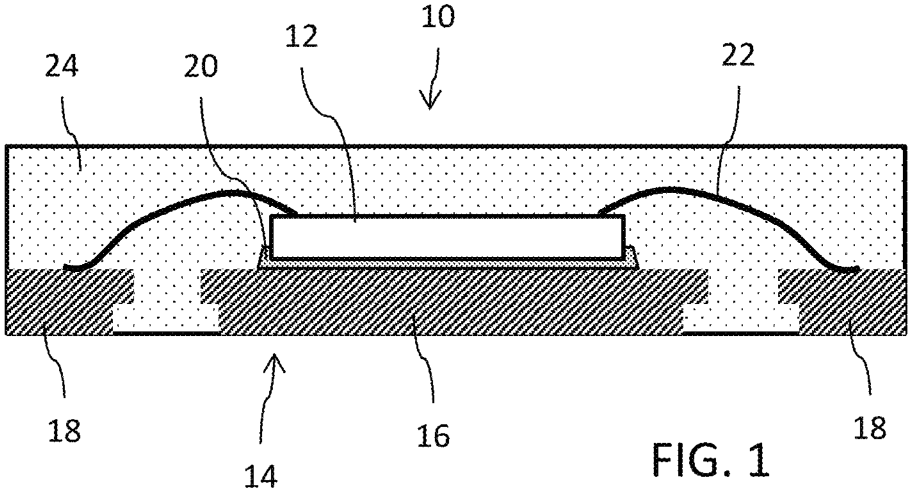
FIG. 1 (Prior Art)
FIGS. 1, 2 and 3 illustrate examples of a conventional QFN type package.
Figure 2:
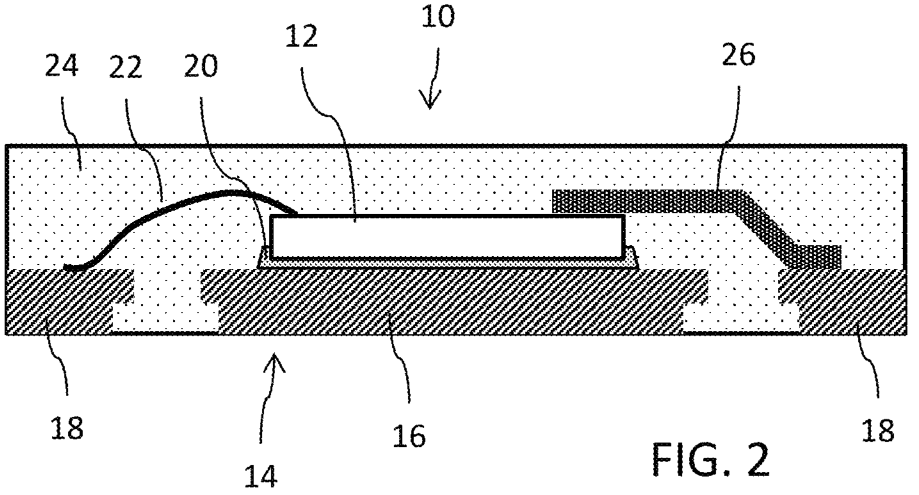
FIG. 2 (Prior Art)
Figure 3:
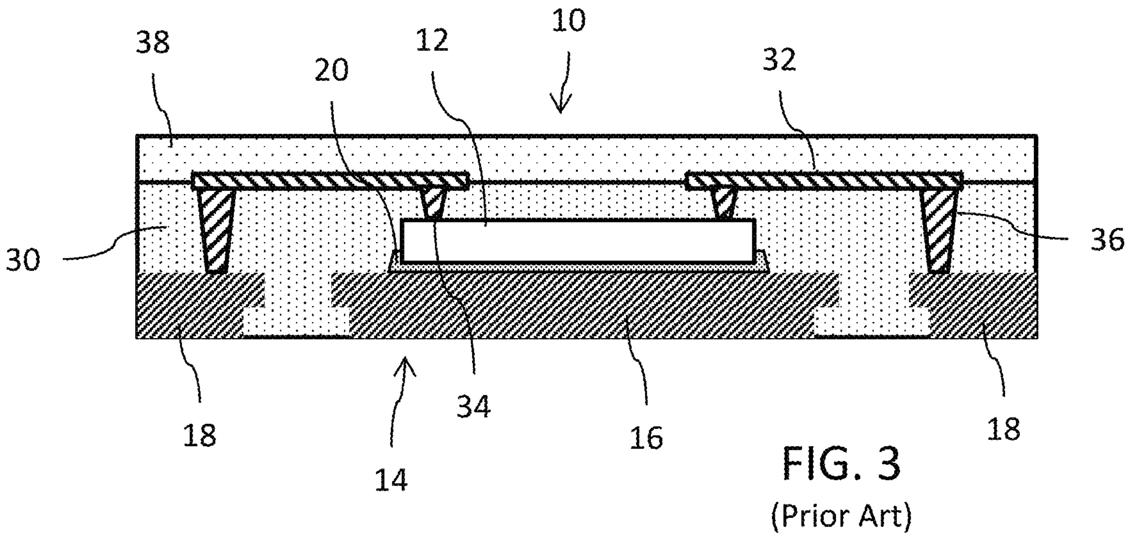
FIG. 3 (Prior Art)
Figure 4:
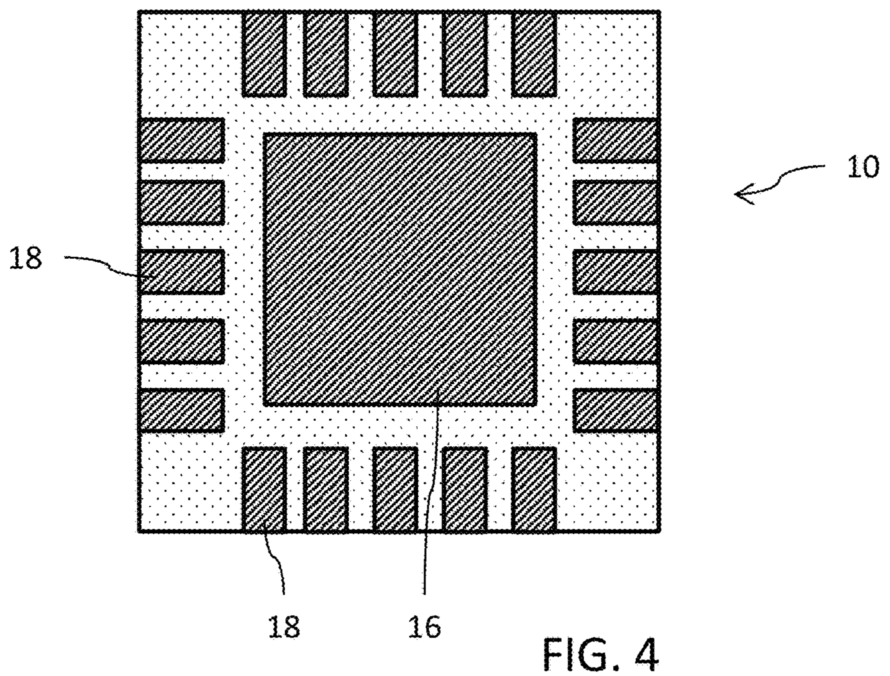
FIG. 4 (Prior Art)
FIG. 4 shows a bottom view of the conventional QFN type package.
Figure 5A:
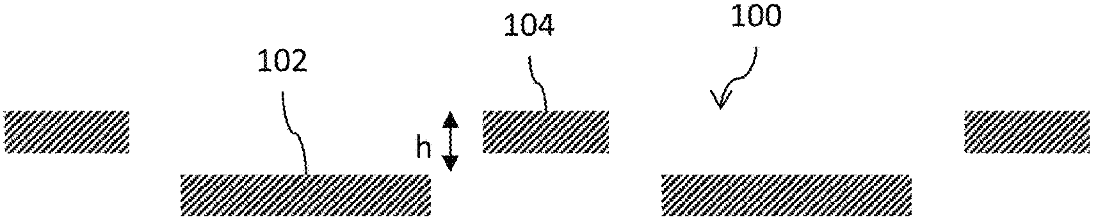
FIGS. 5A-5T show steps in a process for manufacturing a hybrid quad flat no-leads (QFN) type package for one or more integrated circuit (IC) devices.
Figure 5B:
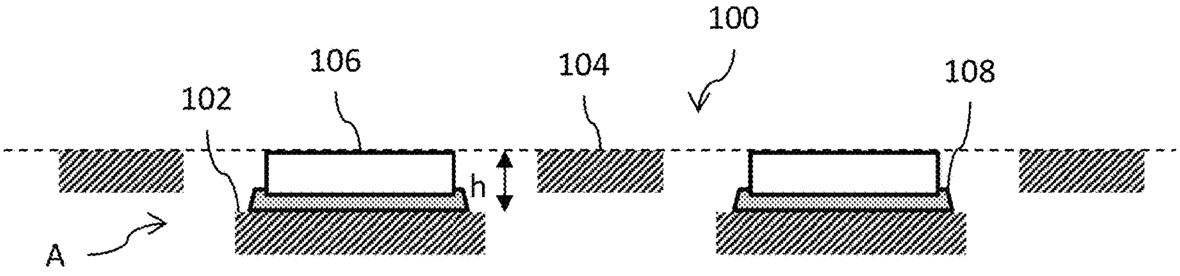
Figure 5C:
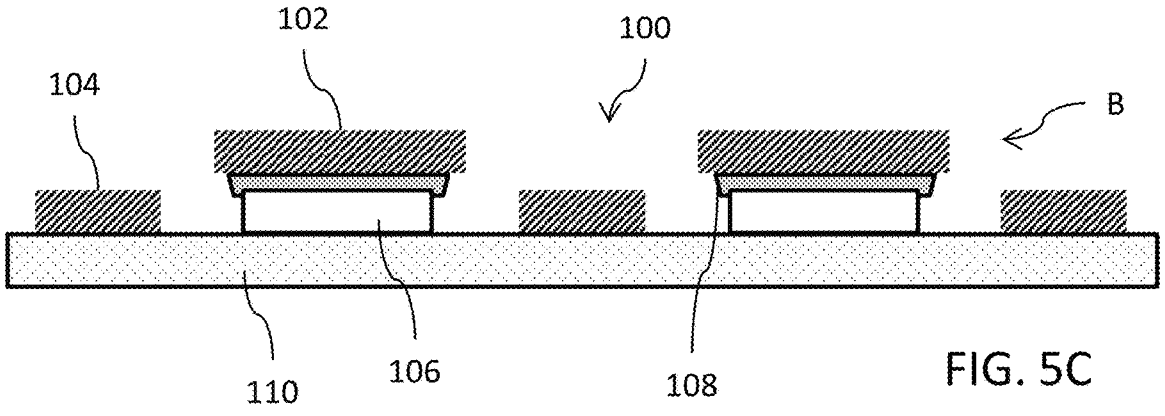
Figure 5D:
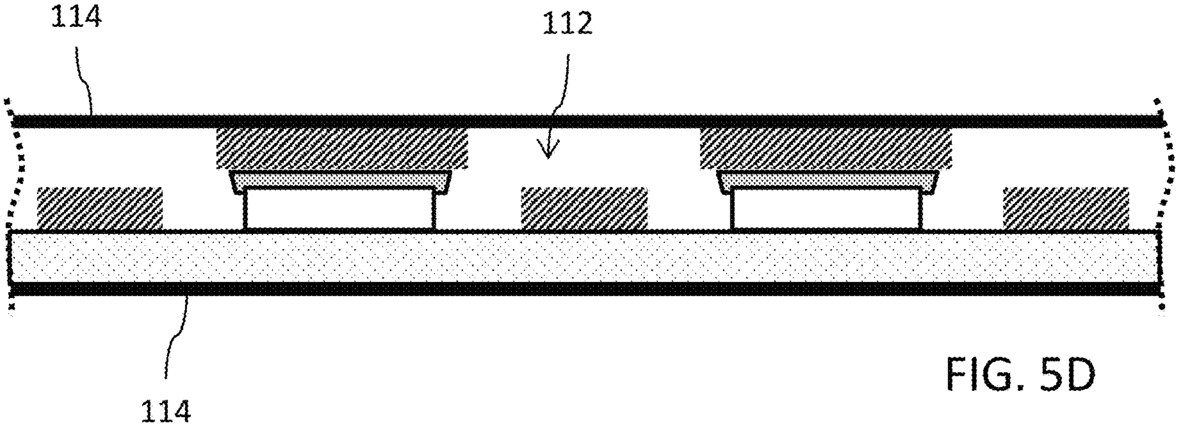
Figure 5E:
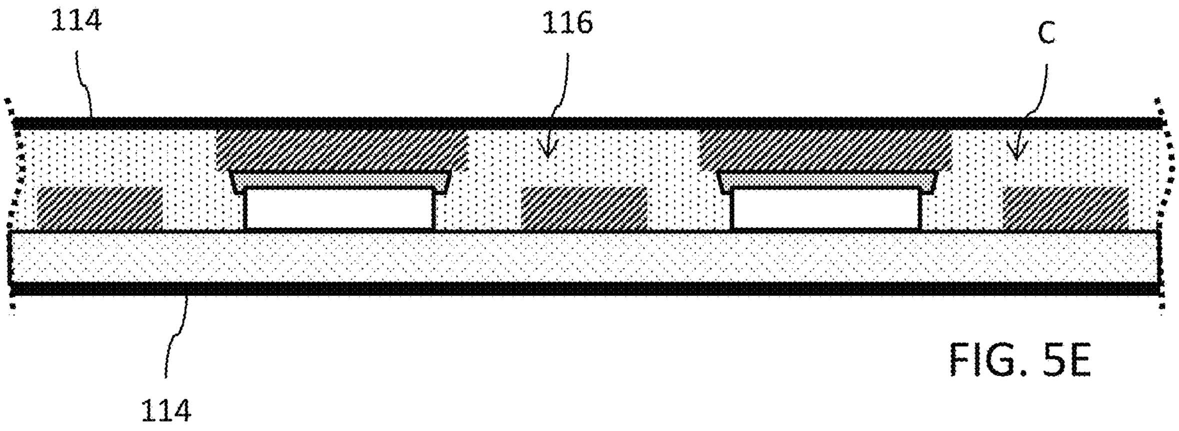
Figure 5F:
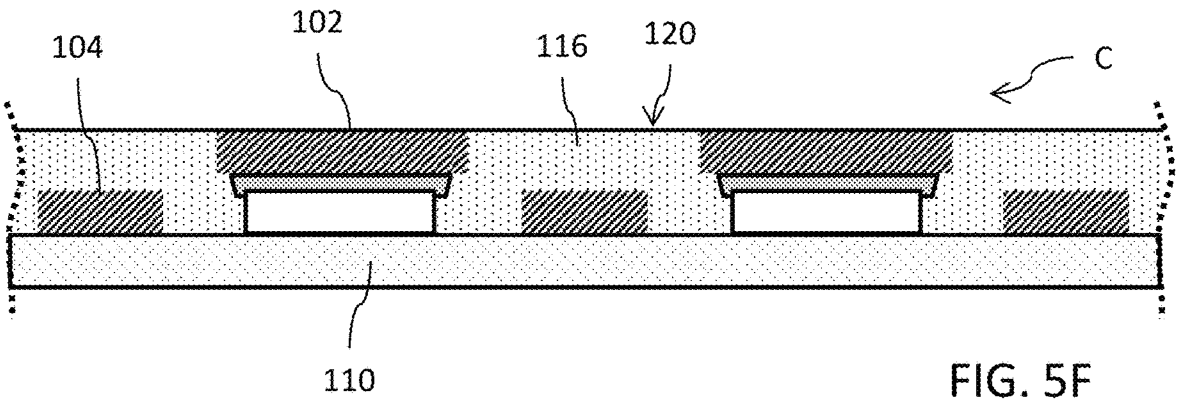
Figure 5G:
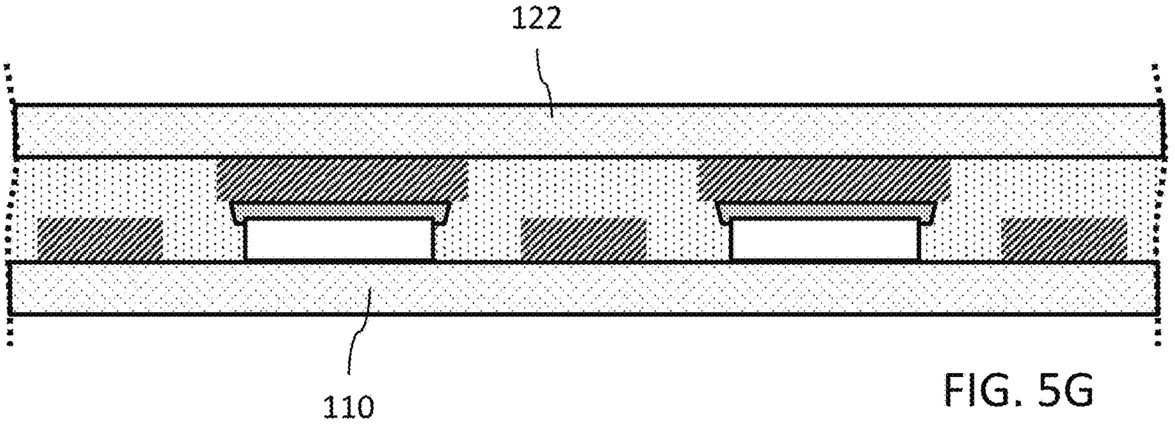
Figure 5H:
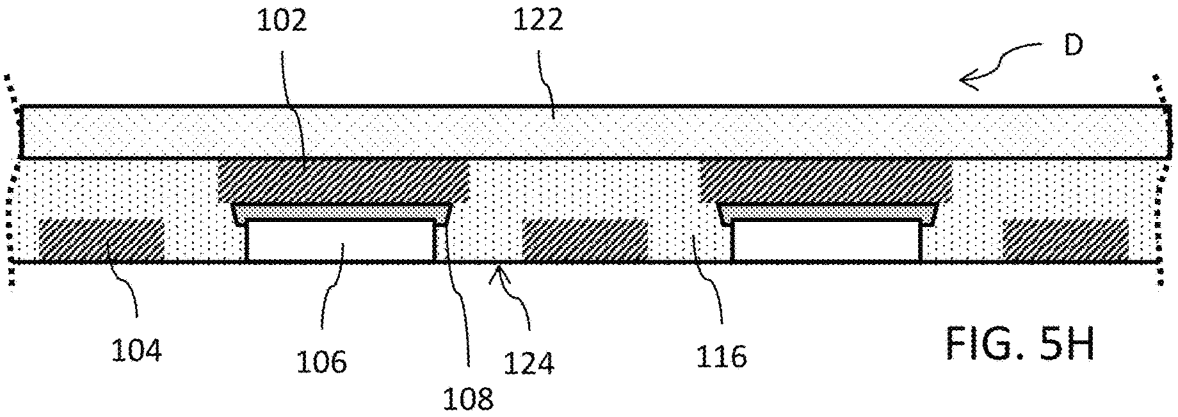
Figure 5I:
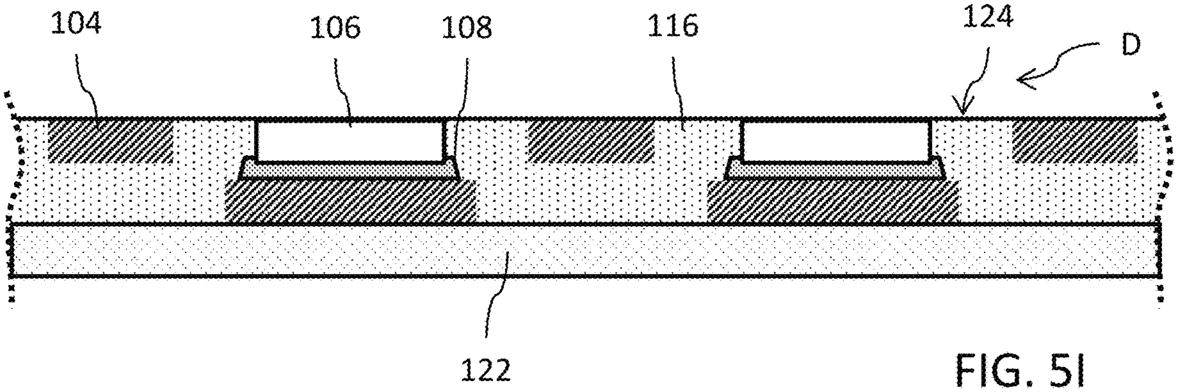
Figure 5J:
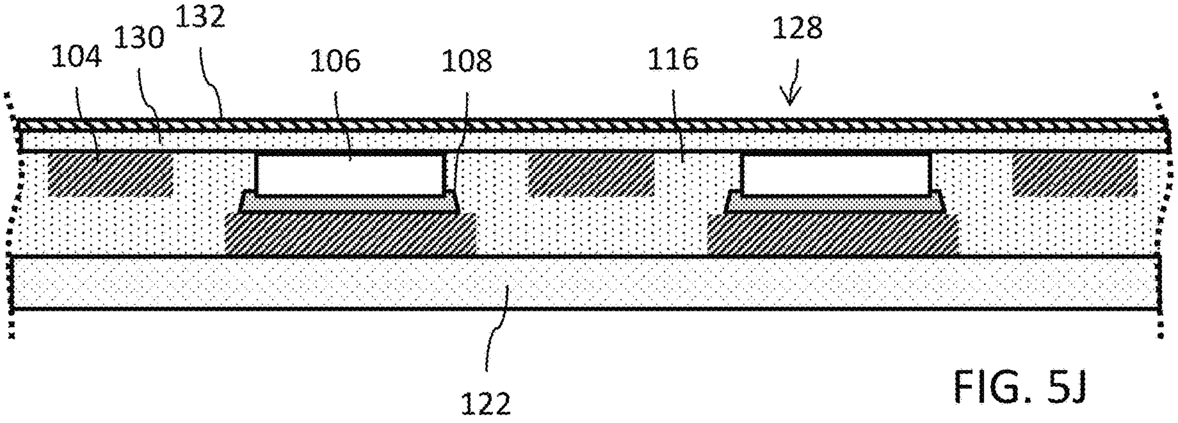
Figure 5K:
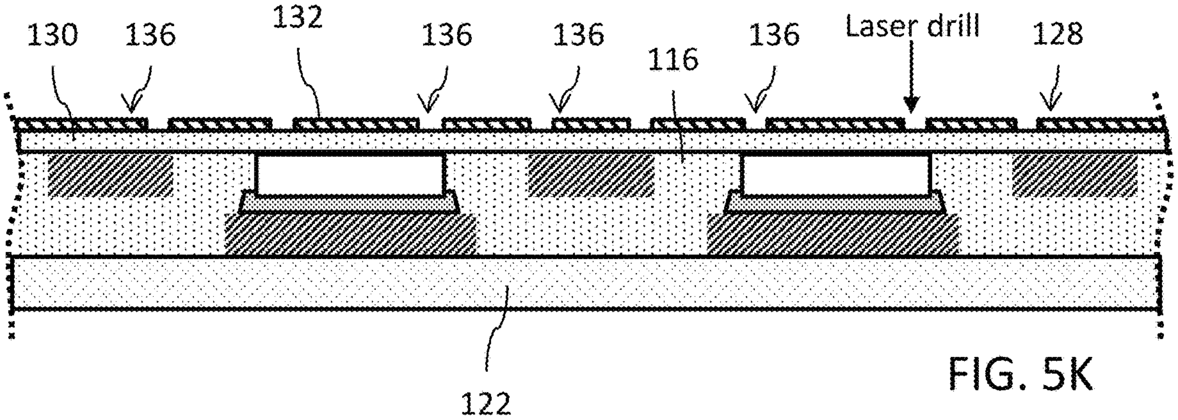
Figure 5L:
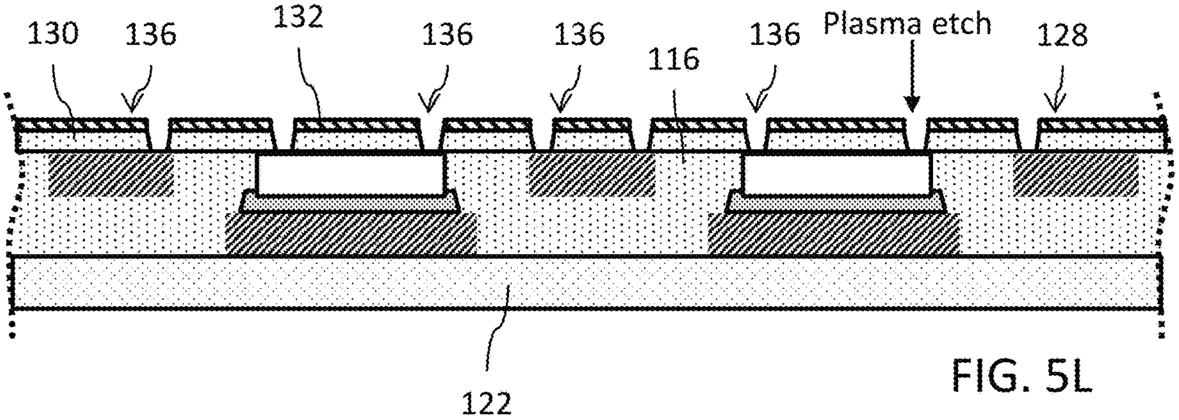
Figure 5M:
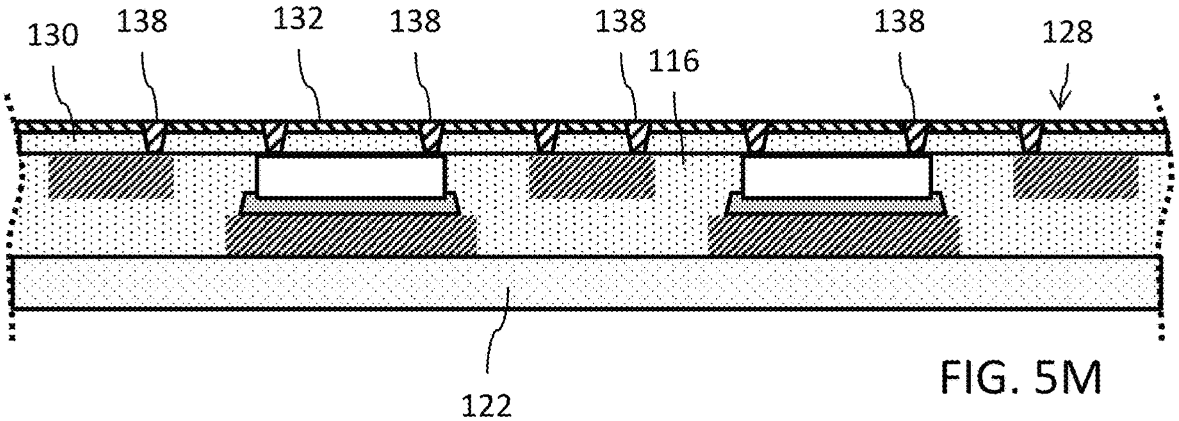
Figure 5N:
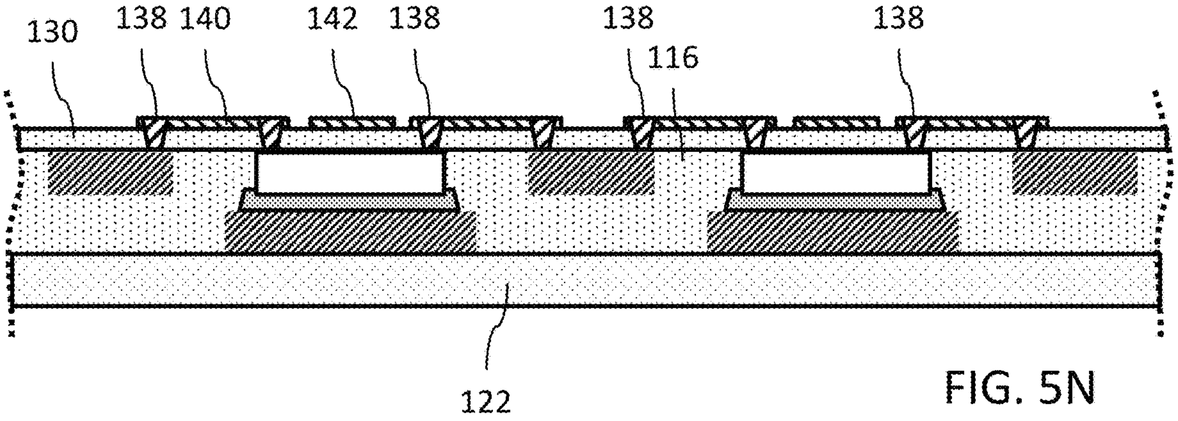
Figure 5O:
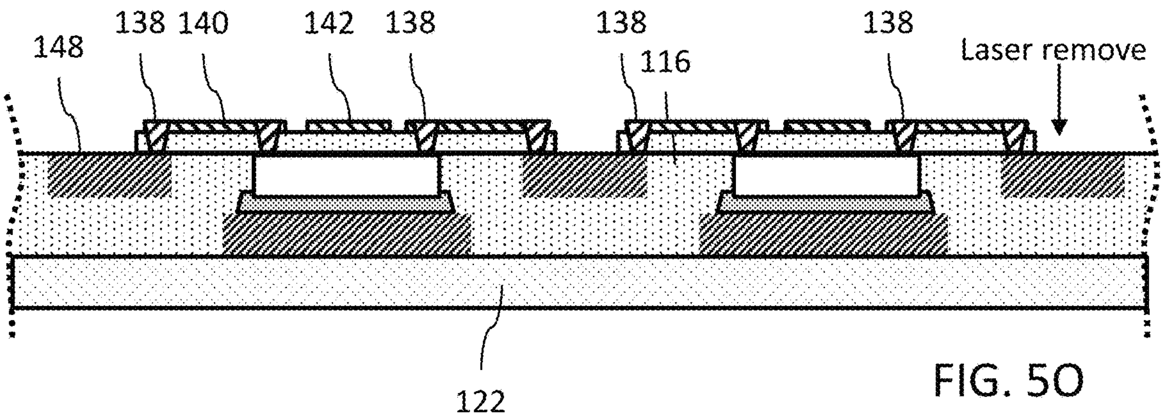
Figure 5P:
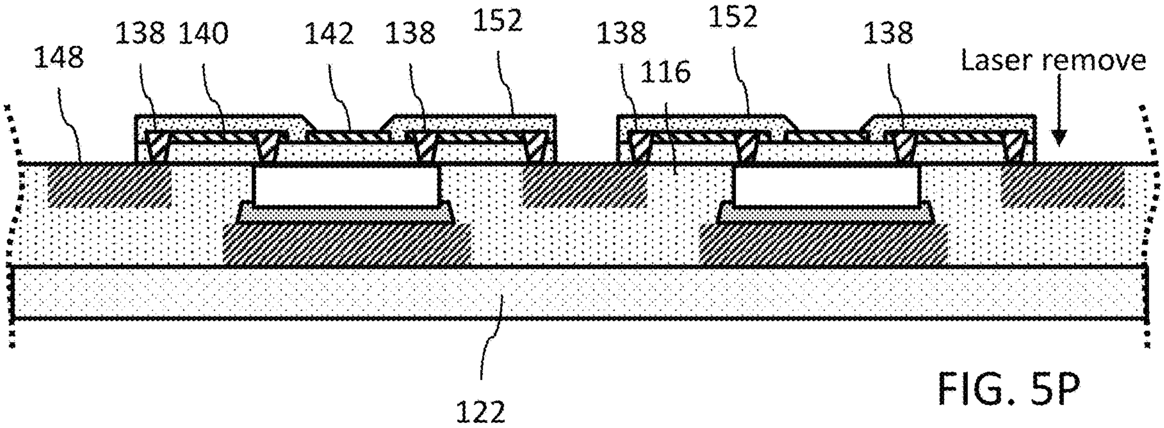
Figure 5Q:
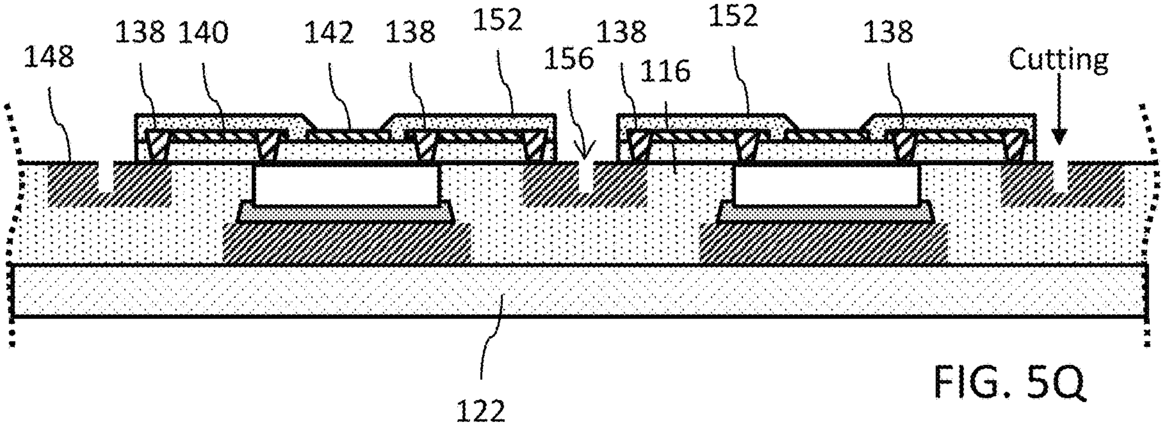
Figure 5R:
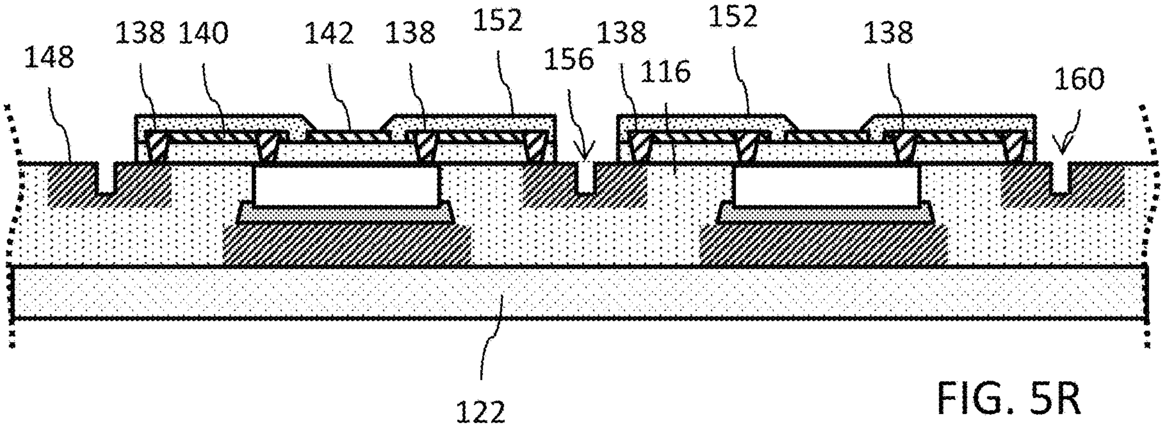
Figure 5S:
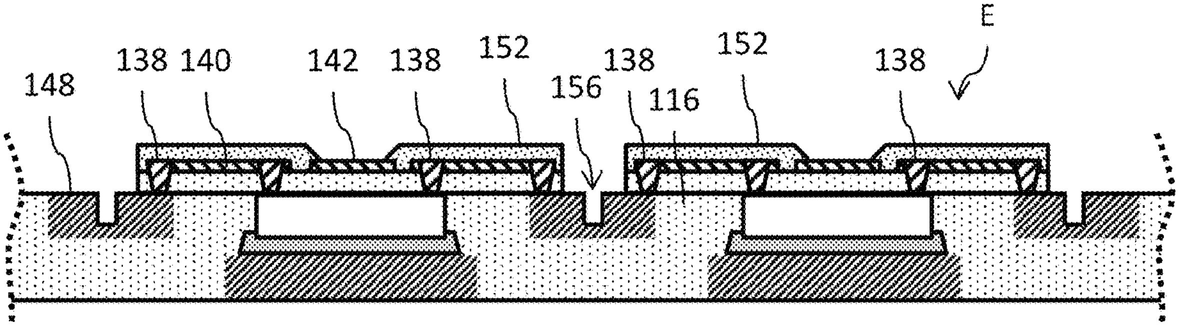
Figure 5T:
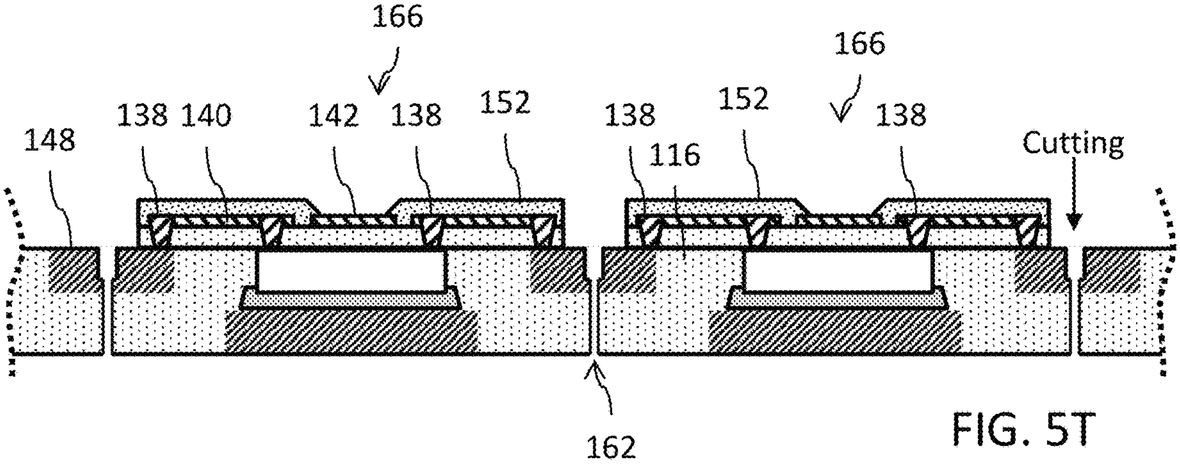

Reference is made to FIGS. 5A-5T which show steps in a process for manufacturing a hybrid quad flat no-leads (QFN) type package for one or more integrated circuit (IC) devices.

FIG. 5A—a lead frame 100 is provided. The lead frame 100 includes die pads 102 and leads 104. The lead frame 100 is shaped with a bend (for example, using a coining or stamping process) that results in a vertical height offset "h" between the die pads 102 and the leads 104. It will be noted that the cross-section illustration in FIG. 5A is simplified as connecting bar and tie bar structures (known to those skilled in the art) are not shown.

FIG. 5B—the back side of an integrated circuit (IC) device 106 (i.e., the IC die) is mounted to each die pad 102 by a suitable adhesive material 108 (for example, a silver epoxy or a die attach film). It will be noted that the vertical offset "h" for the leadframe is selected so that a front surface of the IC device 106 (i.e., the surface including the conductive pads) is substantially coplanar (as indicated by the dotted line) with the front surface of the leads 104. In this context, substantially coplanar means in the same plane or nearly the same plane to within manufacturing tolerances of the lead frame 100 and controlling the offset "h".

FIG. 5C—the assembly A of the IC devices 106 mounted to the lead frame 100 (see, FIG. 5B) is then flipped and mounted to a first supporting substrate 110. The first supporting substrate 110 may, for example, comprise a carrier tape. A suitable adhesive is used to attach the substantially coplanar front faces of the IC devices 106 and leads 104 to the first supporting substrate 110.

FIG. 5D—the assembly B of the IC devices 106, the lead frame 100 and first supporting substrate 110 (see, FIG. 5C) is then placed with the cavity 112 of a mold 114.

FIG. 5E—a resin material is injected into the cavity 112 of the mold 114 and cured to form an encapsulant body 116 which encapsulates the assembly B.

FIG. 5F—the encapsulated assembly C (see, FIG. 5E) is then removed from the mold 114. If necessary, cleanup of the encapsulated assembly C, such as the removal of flashing on the rear surface of the die pads 102, is performed. This may comprise, for example, a backside grind to provide a planarized back side 120 of the encapsulated assembly C.

FIG. 5G—a second supporting substrate 122 is mounted to the planarized back side 120 of the encapsulated assembly C. A suitable adhesive is used to attach the planarized back side 120 to the second supporting substrate 122. The second supporting substrate 122 may, for example, comprise a carrier tape.

FIG. 5H—the first supporting substrate 110 is then removed to expose a planarized front side 124 associated with the coplanar front faces of the IC devices 106 and leads 104.

FIG. 5I—the assembly D (see, FIG. 5H) of the IC devices 106, lead frame 100, encapsulant body 116, and second supporting substrate 122 is then flipped.

FIG. 5J—a resin coated copper (RCC) layer 128 is then laminated to the planarized front side 124. The RCC layer 128 comprises a resin film 130 coated onto a copper film 132. Pressure and temperature is controlled during the lamination to ensure a strong adhesion of the resin film 130 for the RCC layer 128 to the encapsulant body 116 and the coplanar front faces of the IC devices 106 and leads 104 at the planarized front side 124.

FIG. 5K—a laser drilling process is then performed to produce openings 136 extending through the resin film 130 at locations where vias are desired.

FIG. 5L—using the resin film 130 patterned by laser drilling as a mask, a plasma etching process is performed to extend the depth of the openings 136 to reach pads at the front faces of the IC devices 106 and reach the front faces of the leads 104.

FIG. 5M—a plating process (for example, electroless) is then performed to plate the extended openings 136 and form conductive vias 138.

FIG. 5N—using lithographic processing techniques (for example, a patterned mask and etch), the copper film 132 of the RCC layer 128 is patterned to define wiring lines 140 that extend between conductive vias 138 and further define thermal pads 142 over the IC devices 106.

FIG. 5O—a laser removal process is then performed to selectively remove portions of the resin film 130 of the RCC layer 128 and expose portions 148 of the front faces of the leads 104.

FIG. 5P—a solder mask layer 152 is then formed to cover the wiring lines 140. An opening in the solder mask layer 152 exposes a surface portion of the thermal pads 142.

FIG. 5Q—using a cutting tool, openings 156 are made extending into the leads 104. The openings 156 have a depth that is less than a thickness of the leads 104. In an embodiment, the depth is approximately one-half the thickness of the leads 104.

FIG. 5R—a thin layer 160 of Ni/Ag or Sn is then plated onto the exposed surfaces of the leads 104. This includes the sidewalls and bottom of each opening 156. This layer 160 is also plated on the exposed surface portion of the thermal pads 142.

FIG. 5S—the second supporting substrate 122 is then removed to provide an assembly E.

FIG. 5T—using a cutting tool, openings 162, which are aligned with the location of openings 156, are made in the assembly E (see, FIG. 5S) though the remaining portion of the leads 104 and completely through the encapsulant body 116. The processing operation is referred to in the art as a singulation which produces a plurality of QFN type packages 166.

Figure 6:
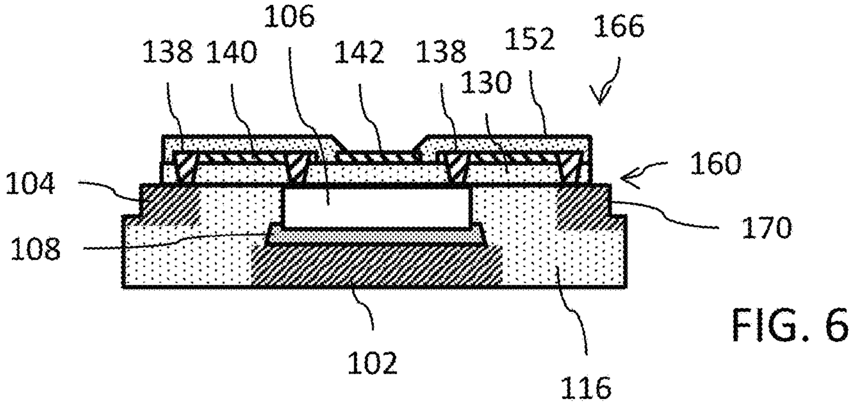
FIG. 6 shows a singulated package formed from the process of FIGS. 5A-5T.

A singulated package 166 is shown in FIG. 6. The package 166 includes a lead frame with a die pad 102 and a plurality of leads 104. The leads 104 are vertically offset (see, height offset "h") from the die pad 102. The back side of the integrated circuit device 106 is mounted to the front side of the die pad 102. The front surface of the integrated circuit device 106 is substantially coplanar with the front surface of the plurality of leads 104. The encapsulant body 116 encapsulates the lead frame and integrated circuit device. A front surface of the encapsulant body 116 is coplanar with the coplanar front surfaces of the integrated circuit device 106 and the plurality of leads 104.

The resin layer 130 covers the coplanar front surfaces of the integrated circuit device 106 and the encapsulant body 116. The resin layer 130 further covers a first portion (at a proximal end of each lead) of the front surfaces of the plurality of leads 104. A second portion (at a distal end of each lead) of the front surfaces of the plurality of leads is not covered by the resin layer 130. The second portion is located at a peripheral edge of the encapsulant body 116.

A patterned metal layer on the resin layer 130 forms wiring lines 140 and vias 138 (which extend through the resin layer 130) electrically connect the wiring lines 140 to connect to the front surface of the leads (at the first portion) and to pads at the front surface of the integrated circuit device 106. The passivation layer 152 covers the wiring lines 140 and vias 138. The patterned metal layer providing wiring lines 140 along with the vias 138 provides a redistribution layer (RDL) for the circuits.

A back surface of the encapsulant body 116 is coplanar with a back surface of the die pad 102. A peripheral edge surface of each lead 104 is notched to form a wettable flank 170 covered by the layer 160. The patterned metal layer on the resin layer 130 further forms a thermal pad 142 that is vertically aligned with the integrated circuit device 106. The passivation layer 152 includes an opening exposing a portion of the thermal pad 142.

The peripheral edge of each lead 104 is coplanar with the peripheral edge of the encapsulant body 116 to provide quad flat no-lead type package structure.

Figure 7:
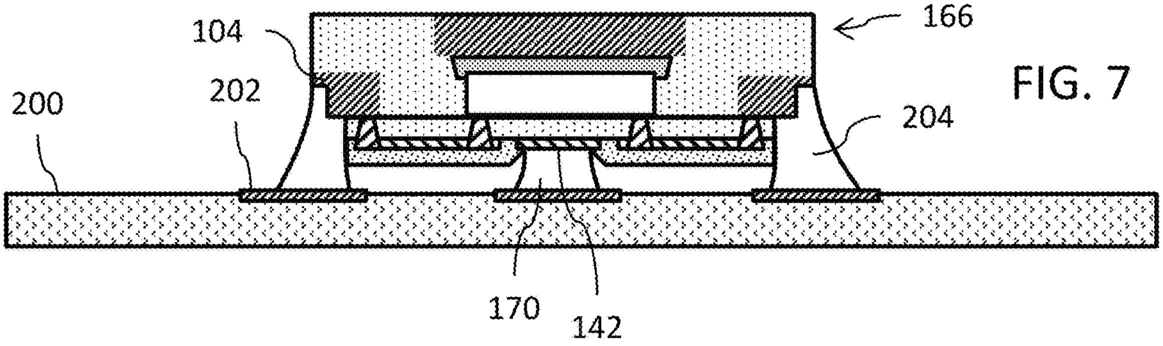
FIG. 7 shows the singulated package of FIG. 6 mounted to a circuit substrate.

FIG. 7 illustrates the mounting of the package 166 to a supporting substrate 200 (such as, for example, a printed circuit board). The substrate includes pads 202 with solder material 204 used to electrically connect the leads 104 (at the wettable flank 170) to the pads 202 and thermally connect the thermal pads 142 to the pad 202.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. An integrated circuit package, comprising:

a lead frame including a die pad and a plurality of leads, wherein leads of the plurality of leads are vertically offset from the die pad;

an integrated circuit device mounted to the die pad, with a front surface of the integrated circuit device substantially coplanar with a front surface of the plurality of leads;

an encapsulant body that encapsulates the lead frame and integrated circuit device; wherein a front surface of the encapsulant body is coplanar with the substantially coplanar front surfaces of the integrated circuit device and the plurality of leads;

an insulating layer covering the coplanar front surfaces of the integrated circuit device and the encapsulant body and further covering a first portion of the front surfaces of the plurality of leads with a second portion of the front surfaces of the plurality of leads at a peripheral edge of the encapsulant body being uncovered by the insulating layer;

a patterned metal layer on the insulating layer forming wiring lines;

vias connected to the wiring lines of the patterned metal layer and extending through the insulating layer to connect to the front surfaces of the leads and to pads at the front surface of the integrated circuit device; and a passivation layer covering the wiring lines of the patterned metal layer.

2. The integrated circuit package of claim 1, wherein a back surface of the encapsulant body is coplanar with a back surface of the die pad.

3. The integrated circuit package of claim 1, wherein a peripheral edge surface of each lead of the plurality of leads includes a wettable flank.

4. The integrated circuit package of claim 1, wherein the patterned metal layer further forms a thermal pad vertically aligned with the integrated circuit device, and wherein the passivation layer includes an opening exposing a portion of the thermal pad.

5. An integrated circuit package, comprising:

an encapsulant body that encapsulates a lead frame and an integrated circuit (IC) device;

wherein the lead frame includes a die pad and vertically offset leads;

wherein back sides of the die pad and encapsulant body are coplanar at a first surface;

wherein front sides of the leads, the IC device and the encapsulant body are substantially coplanar at a second surface;

an insulating layer covering the second surface except at a portion of the leads located at a peripheral edge of the encapsulating body;

vias extending through the insulating layer to the leads and the IC device;

wiring lines on the insulating layer that interconnect the vias; and a passivation layer covering the wiring lines and vias.

6. The integrated circuit package of claim 5, wherein a peripheral edge surface of each lead includes a wettable flank.

7. The integrated circuit package of claim 6, further comprising a thermal pad on the insulating layer, wherein said thermal pad is vertically aligned with the IC device, and wherein passivation layer includes an opening exposing a portion of the thermal pad.

* * * * *